US012690415B2

(12) United States Patent
Haas et al.

(10) Patent No.: US 12,690,415 B2
(45) Date of Patent: Jul. 21, 2026

(54) DEVICE AND METHOD FOR HANDLING POT-SHAPED HOLLOW BODIES, MORE PARTICULARLY TRANSPORT CONTAINERS FOR SEMICONDUCTOR WAFERS OR EUV LITHOGRAPHY MASKS

(71) Applicant: GSEC German Semiconductor Equipment Company GmbH, Furtwangen (DE)

(72) Inventors: Gunter Haas, St. Georgen (DE); Jürgen Gutekunst, Steckborn (CH); Frank Schienle, Freiburg (DE)

(73) Assignee: GSEC GERMAN SEMICONDUCTOR EQUIPMENT COMPANY GMBH, Furtwangen (DE)

( * ) Notice: Subject to any disclaimer, the term of this patent is extended or adjusted under 35 U.S.C. 154(b) by 563 days.

(21) Appl. No.: 18/035,216

(22) PCT Filed: Nov. 5, 2021

(86) PCT No.: PCT/EP2021/080794
§ 371 (c)(1),
(2) Date: May 3, 2023

(87) PCT Pub. No.: WO2022/096658
PCT Pub. Date: May 12, 2022

(65) Prior Publication Data
US 2023/0411195 A1      Dec. 21, 2023

(30) Foreign Application Priority Data
Nov. 9, 2020    (DE) ..................... 10 2020 129 470.0

(51) Int. Cl.
*H10P 72/30*        (2026.01)
*H10P 72/10*        (2026.01)

(52) U.S. Cl.
CPC ...... *H10P 72/3304* (2026.01); *H10P 72/1918* (2026.01)

(58) Field of Classification Search
None
See application file for complete search history.

(56) References Cited

U.S. PATENT DOCUMENTS

| | | | |
|---|---|---|---|
| 9,171,748 B2 | 10/2015 | Hatano et al. | |
| 2002/0046760 A1* | 4/2002 | Halbmaier | B08B 3/02 |
| | | | 134/171 |

(Continued)

FOREIGN PATENT DOCUMENTS

| | | |
|---|---|---|
| DE | 19514468 C1 | 10/1996 |
| EP | 0738545 A1 | 10/1996 |

(Continued)

OTHER PUBLICATIONS

International Search Report issued Feb. 2, 2022 in PCT/EP2021/080794.

*Primary Examiner* — Michael S Lowe
(74) *Attorney, Agent, or Firm* — Panitch Schwarze Belisario & Nadel LLP

(57)           ABSTRACT

A device for handling pot-shaped hollow bodies, more particularly transport containers for semiconductor wafers or for EUV lithography masks includes a wall, which encloses an inner space, a gripping and moving apparatus arranged in an inner space for moving the hollow body within the inner space and a wall opening which is formed by the wall, can be closed by a closure body and through which the inner space is accessible. The device includes a lid handling unit which can be detachably connected to the lid. The lid can be connected to the lid handling unit and is separated from the hollow body.

12 Claims, 7 Drawing Sheets

(56)         References Cited

U.S. PATENT DOCUMENTS

| | | |
|---|---|---|
| 2003/0102015 A1 | 6/2003 | Halbmaier et al. |
| 2010/0319730 A1 | 12/2010 | Rebstock |
| 2011/0284038 A1 | 11/2011 | Bang et al. |
| 2019/0247900 A1 | 8/2019 | Park et al. |
| 2023/0402298 A1* | 12/2023 | Haas ...................... B08B 9/093 |

FOREIGN PATENT DOCUMENTS

| | | |
|---|---|---|
| JP | H07297260 A | 11/1995 |
| JP | 2012064828 A | 3/2012 |
| JP | 2018107233 A | 7/2018 |
| JP | 2020065015 A | 4/2020 |
| KR | 101244381 B1 | 4/2013 |
| KR | 101265182 B1 | 5/2013 |
| KR | 101848700 B1 | 4/2018 |

* cited by examiner 20,54

20,54

58          20,62

58          P          20,62

58          20,62

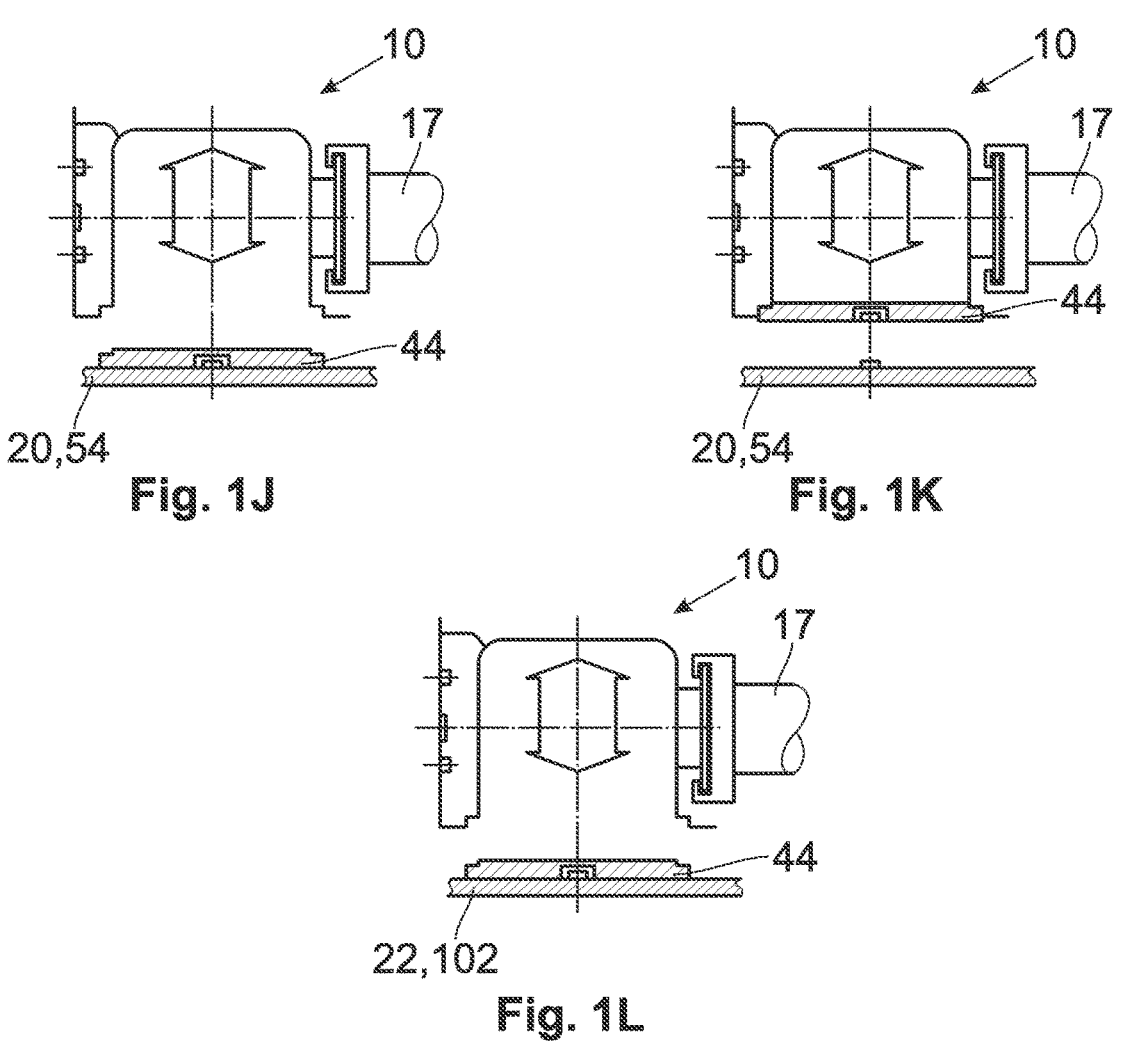
Fig. 1J
Fig. 1K
Fig. 1L
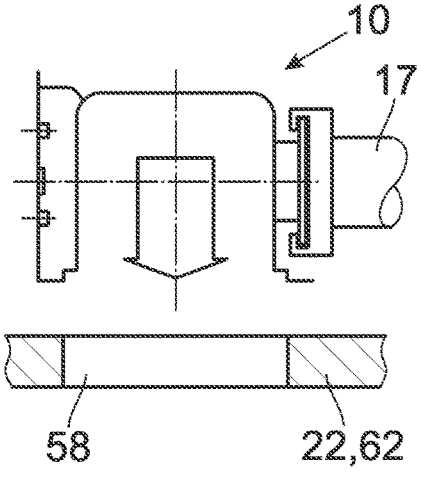
Fig. 1M
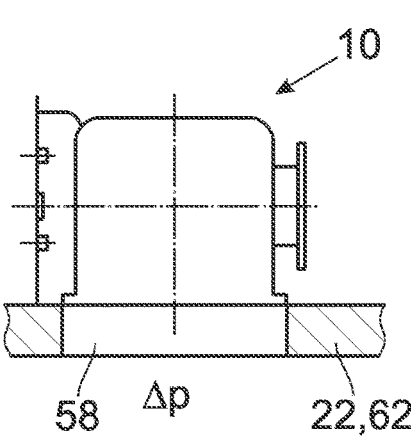
Fig. 1N

DEVICE AND METHOD FOR HANDLING POT-SHAPED HOLLOW BODIES, MORE PARTICULARLY TRANSPORT CONTAINERS FOR SEMICONDUCTOR WAFERS OR EUV LITHOGRAPHY MASKS

CROSS-REFERENCE TO RELATED APPLICATIONS

This application is a Section 371 of International Application No. PCT/EP2021/080794, filed Nov. 5, 2021, which was published in the German language on May 12, 2022 under International Publication No. WO 2022/096658 A1, which claims priority under 35 U.S.C. § 119(b) to German Patent Application No. 10 2020 129 470.0, filed Nov. 9, 2020, the disclosures of which are incorporated herein by reference in their entireties.

BACKGROUND OF THE INVENTION

The preferred invention relates to a device for handling pot-shaped hollow bodies, in particular transport containers for semiconductor wafers or for extreme ultraviolet radiation ("EUV") lithography masks. The preferred invention further relates to a corresponding method.

The manufacture of highly integrated electronic circuits and other sensitive semiconductor components takes place today in factories in which so-called semiconductor wafers run through a large number of processing steps. A large part of these processing steps takes place in clean rooms that are kept free of contaminants, in particular free of particles, with a high effort. Such a complex processing is necessary since particles that come into contact with the semiconductor material of the semiconductor wafers can in particular influence the material properties of the semiconductor wafers such that a total production batch becomes defective and unusable and has to be scrapped.

Since the keeping clean is becoming more and more important as the integration density of the semiconductor circuits and the effort to keep clean increase exponentially as the size of the clean rooms increases, the semiconductor wafers are not transported from one processing station to the next in an "open" state. Special transport containers (so-called FOUPs, front opening unified pods) are used instead. They are understood as box-shaped transport containers into which a large number of semiconductor wafers is inserted. The FOUPs are typically closed by a removable cover. Without the cover the FOUPs have a pot-shaped basic shape with a rectangular base surface. When the FOUPs are closed by their covers, the inserted semiconductor wafers can be transported from one clean room to another clean room protected from the environment. When the FOUPs have reached a processing station, they are opened, the semiconductor wafers are removed, and are processed accordingly. After processing has taken place, the semiconductor wafers are transported back into the FOUPs and are then conveyed to the next processing station.

Due to the high production downtimes on contaminations of the semiconductor wafers, it is necessary to clean the FOUPs from time to time. The FOUPs are in particular contaminated by the wear debris of the semiconductor wafers on the introduction into and the removal from the FOUPs.

The same applies accordingly to the transport containers for EUV lithography masks ("extreme ultraviolet radiation"). The EUV lithography masks are used to manufacture very small integrated circuits. The EUV lithography masks, like the semiconductors, also have to be transported, with a similar situation arising. When FOUPs are spoken of in the following, the statements in this respect apply equally to transport containers for EUV lithography masks.

Devices for cleaning FOUPs are known, for example, from U.S. Pat. No. 5,238,503 A, International Patent Application Publication No. WO 2005/001888 A2, and European Patent No. EP 1 899 084 B1. It can in particular be seen from European Patent No. EP 1 899 884 B1 that such devices have a plurality of handling units in which different handling steps for cleaning the FOUPs are carried out. The FOUPs are transported from one handling unit to the next handling unit by means of a gripping and moving device that can, for example, be designed as a robot gripper.

As initially mentioned, the FOUPs comprise a cover by which the inner hollow body space can be closed. A cleaning of the FOUPs only at their outer surfaces admittedly also contributes to the reduction of defective semiconductor wafers; however, this contribution is considerably smaller in comparison with a cleaning at its inner surface. However, to be able to clean the inner surface, the cover has to be removed; as a consequence, the gripping and moving device used has to perform comparatively complex movement routines. Since the FOUPs are typically in a position during the cleaning process that is not changed during the cleaning process, the gripping and moving device has to have a relatively long radius of action to be able to grip and move the FOUPs. The gripping and moving device can moreover not always be operated at full speed.

The devices in which the FOUPs are cleaned typically have a wall that has a wall opening through which the inner space formed by the wall is accessible. The introduction into and the removal from the inner space likewise represents a time intensive step.

The gripping and moving devices used are expensive due to the named circumstances; the cleaning process moreover lasts relatively long due to the complex movement routines.

BRIEF SUMMARY OF THE INVENTION

It is an object of the present invention to provide a device for handling pot-shaped hollow bodies, in particular transport containers for semiconductor wafers, by which it is possible to shorten the duration of the cleaning process using simple and inexpensive means.

It is furthermore an object underlying an embodiment of the present invention to provide a method of handling pot-shaped hollow bodies, in particular transport containers for semiconductor wafers by which the device can be operated.

This object is achieved by the features specified in the present disclosure. Advantageous embodiments of the preferred invention form the subject matter of the present disclosure.

The preferred present invention will be described with reference to hollow bodies in the following since the invention is not restricted to FOUPs or to transport containers for EUV lithography masks.

An embodiment of the invention relates to a device for handling pot-shaped hollow bodies, in particular transport containers for semiconductor wafers or for EUV lithography masks, comprising:

a wall that surrounds an inner space;

a gripping and moving device arranged in the inner space
  for moving the hollow body within the inner space; and a wall opening that is formed by the wall, that is closable
by a closure body, and through which the inner space
is accessible, with the closure body
being movably supported in the device by means of a
fastening unit; and
having a reception unit by which the hollow body is
releasably connected to the closure body.

The hollow body can be connected to, moved by, and
released again from the closure body. The closure body
simultaneously serve the closing of the wall opening.

The hollow body is connected to the closure body, with
two steps being performed for this purpose. The hollow
body is first placed onto the closure body, which can take
place manually. The hollow body is subsequently locked,
which is carried out in an automated manner.

The closure body is then moved into a position in which
the opening is closed, with the hollow body being connected
to the closure body such that it can be gripped and subse-
quently moved in the inner space by the gripping and
moving device. The closure body is integrated in the move-
ment routine that the hollow body runs through during the
handling, with the hollow body being introduced into and
removed from the inner space with the closure body.

In accordance with a further embodiment, the fastening
unit is formed as a hinge by which the closure body is
rotatably fastened to the wall. The fastening unit can gen-
erally define any desired movement of the closure body; a
parallelogram guidance can be provided, for example. How-
ever, the use of a fastening unit formed as a hinge is
associated with a small technical effort. Hinges can in
particular cooperate with a drive device in a simple manner.
Hinges are moreover characterized by high reliability.

In a further developed embodiment, the closure body can
be movable between a first position and a second position,
with the closure body closing the wall opening in the first
position and in the second position.

The closure body can be of an L shape and can have two
limbs that intersect at the pivot point. In the first position, the
hollow body is connected to the reception section of the
closure body located on the second limb, with the hollow
body being located outside the inner space. The wall open-
ing is closed by the first limb. In the second position, the
hollow body is arranged within the inner space, with the wall
opening being closed by the second limb. Since both the first
position and the second position can be selected such that the
closure body is easily accessible, the movement routine is
kept simple and short. A complicated transfer through the
wall opening is omitted. The inner space is also closed on the
transition of the closure body from the first position into the
second position. An additional step is not required for this.

In a further developed embodiment, the hollow body can:
have a first gripping section; and
a second gripping section, wherein
the reception section has locking means by which the
closure body can cooperate with the hollow body using
the first gripping section; and
the gripping and moving device has gripping means by
which the gripping and moving device can cooperate
with the hollow body using the second gripping sec-
tion.

In this embodiment, the hollow body has a first gripping
section and a second gripping section. It is consequently
possible to fasten the hollow body at least at times both to
the closure body and to the gripping and moving device. The
locking means can, for example, only be released when the
gripping means fully engage at the hollow body. On the one
hand, the two gripping sections can be arranged such that they are both also easily accessible when the closure body is
connected to the first gripping section, for example. On the
other hand, it can be ensured that the hollow body is securely
connected to at least the gripping and moving device or the
closure body, as a result of which an uncontrolled movement
of the hollow body is avoided. A placement of the hollow
body in the inner space, which could be necessary so that the
gripping and moving device can switch from the first
gripping section to the second gripping section, is not
necessary, whereby time is saved.

In a further developed device, the device can have a
further gripping and moving means for supplying the hollow
body to the closure body and for removing the hollow body
from the closure body. As mentioned further above, the
hollow body can be manually placed onto the closure body
located in the first position and can be automatically locked
and thus connected thereto. The same also applies to the
releasing and removal. The supply to and the removal from
the closure body can be automated by the further gripping
and moving device that is typically arranged outside the
inner space and that can, for example, be formed as an
overhead transport system ("OHT"). The further transport of
the hollow bodies with inserted semiconductor wafers
within a clean room or between a plurality of clean rooms
can also be taken over by the OHT system. The present
device can consequently also be integrated in an OHT
system in accordance with this embodiment.

In a further embodiment, the further gripping and moving
device can have further gripping means by which the further
gripping and moving device can cooperate with the hollow
body using the second gripping section. As mentioned, the
further gripping and moving device is typically arranged
outside the inner space while the gripping and moving
device is typically arranged within the inner space. Since the
two gripping and moving devices are separated by the wall
of the device in this case and the transition of the hollow
body into the inner space is taken over by the closure body,
the two gripping and moving devices can never simultane-
ously be in contact with the hollow body. It is possible with
the device according to the proposal to this extent to use the
second gripping section of the hollow body for two different
gripping and moving devices. The design of the hollow body
can consequently be kept simple since no third gripping
section has to be provided. In addition, the gripping means
of the gripping and moving device and the further gripping
means of the further gripping and moving device can be of
the same design, whereby cost advantages can be achieved.

In a further developed embodiment, in which the hollow
body has:
a base wall and one or more side walls;
an opening disposed opposite the base wall; and
a cover by which the opening is closable,
is characterized in that the device has at least one cover
handling unit that is releasably connectable to the cover.

As mentioned, a cleaning of the hollow bodies, in par-
ticular of the FOUPs, only contributes to the reduction of
defective semiconductor wafers to a considerably smaller
degree at their outer surfaces in comparison with a cleaning
at their inner surfaces. The hollow body has to be opened to
clean the inner surface, for which purpose the cover has to
be removed from the hollow body, which can take place in
an automated manner using the cover handling unit. The
device in accordance with the present embodiment conse-
quently also enables a cleaning of the inner surface with the
above-mentioned advantages.

In accordance with a further embodiment the device has at least one handling unit by which the hollow body can be handled and a cover handling unit, wherein the handling unit has a process space in which the hollow body can be handled;

the process space is accessible through a process space opening; and the cover handling unit is movably supported in the device by means of a further fastening device between an open position in which the cover handling unit releases the process space opening and a closure position in which the cover handling unit closes the process space opening.

As mentioned, the cover is releasably connected to the cover handling unit. Similar to the closure body, the cover handling unit is integrated in the handling of the hollow body, in this case in the handling of the cover of the hollow body. The cover is introduced into the handling unit in that the cover handling unit is moved from the open position into the closure position and vice versa. A complicated introduction into and a removal from the process space is again omitted.

A further embodiment is characterized in that the device has a first handling unit that is formed as a cleaning device for cleaning the hollow body and/or the cover. As mentioned, the cleaning of the hollow bodies plays a decisive role in the reduction of defective semiconductor wafers. In this embodiment, the significance of the cleaning is taken into account. It is worthy of mention at this point that the cover can be cleaned separately from the remaining hollow body. The inner cover surface can in particular also be cleaned. A cleaning fluid is typically used for this purpose.

In a further embodiment, the device can have a second handling unit that is formed as an evacuation device for applying a vacuum to the hollow body and/or at the cover. The application of a vacuum serves to remove residues of the cleaning fluid that remain on the surface of the hollow body and of the cover as a result of the cleaning of the hollow body in the cleaning device. The moisture also diffuses into microscopically small pores of the surface of the hollow body and of the cover due to the capillary effect. This moisture can likewise be removed by the vacuum so that a drying is also made possible on a microscopic level.

It consequently appears sensible to supply the hollow body to the cleaning device first and subsequently to the evacuation device.

An embodiment of the preferred invention relates to a method of handling pot-shaped hollow bodies, in particular transport containers for semiconductor wafers or for EUV lithography masks, using a device in accordance with one of the previous embodiments, said method comprising the following steps:

moving the closure body into the first position in which the reception section is arranged outside the inner space;

supplying the hollow body to the reception section and activating the reception section to connect the hollow body to the closure body; and moving the closure body into the second position in which the closure body closes the wall opening.

The technical effects and advantages that can be achieved with the method according to the proposal correspond to those that have been discussed for the present device for handling pot-shaped hollow bodies, in particular transport containers for semiconductor wafers. It must be pointed out in summary that the gripping and moving device hereby has to perform simpler movement routines in comparison with methods known from the prior art and can therefore be of a simpler design. In addition, the movement routines can be performed faster so that the duration of the movement procedure can be reduced.

In a further embodiment in which the hollow body has a first gripping section and a second gripping section, the method comprises the following steps:

supplying the hollow body to the closure body by means of a further gripping and moving device that has further gripping means by which the further gripping and moving device is connected to the hollow body using the second gripping section;

activating the locking means of the reception section for connecting the hollow body to the closure body using the first gripping section;

releasing the further gripping and moving device from the second gripping section;

moving the closure body into the closed position in which the closure body closes the wall opening;

connecting the hollow body to the gripping and moving device using the second gripping section; and releasing the hollow body from the closure body by deactivating the reception section.

The supply of the hollow body to and the removal from the closure body can be automated.

In accordance with a further developed embodiment in which the hollow body has a base wall and one or more side walls;

an opening disposed opposite the base wall; and a cover by which the opening is closable, the method comprises the following steps:

supplying the hollow body to the cover handling unit by means of the gripping and moving device;

connecting the cover to the cover handling unit; and separating the cover from the hollow body by means of the cover handling unit and/or the gripping and moving device.

In this embodiment of the method, the hollow body can be opened by removing the cover by means of the cover handling unit so that the hollow body can be handled at its inner hollow body surface. The cover can also be handled.

A further developed embodiment of the method in which:

the device comprises at least one handling unit by which the hollow body can be handled, wherein the handling unit cooperates with the cover handling unit; and wherein the handling unit has a process space in which the hollow body can be handled; and the process space is accessible through a process space opening;

defines the following steps:

moving the cover handling unit into a position in which the cover handling unit releases the process space opening;

connecting the cover to the cover handling unit and separating the cover from the hollow body by means of the cover handling unit and/or the gripping and moving device; and moving the cover handling unit into the closed position in which the cover handling unit closes the process space opening.

In this embodiment of the method, the cover handling unit is not only used to separate the cover from the hollow body, but also to introduce the cover into the process space. A complicated introduction of the cover into and a removal from the process space is again omitted.

BRIEF DESCRIPTION OF THE SEVERAL VIEWS OF THE DRAWING

The foregoing summary, as well as the following detailed description of the preferred invention, will be better understood when read in conjunction with the appended drawings. For the purpose of illustrating the preferred invention, there are shown in the drawings embodiments which are presently preferred. It should be understood, however, that the invention is not limited to the precise arrangements and instrumentalities shown. In the drawings:

FIG. 1J is a front elevational, partial cross-sectional view of a portion of the device of FIG. 1A, wherein the hollow body is moved to the cover handling unit of FIG. 1E;

FIG. 1K is a front elevational, partial cross-sectional view of a portion of the device of FIG. 1A, wherein a cover is connected to the hollow body;

FIG. 1L is a front elevational, partial cross-sectional view of a portion of the device of FIG. 1A, wherein the cover of FIG. 1K is connected to a cover handling unit and released from the hollow body;

FIG. 1M is a front elevational, partial cross-sectional view of a portion of the device of FIG. 1A, wherein the hollow body is moved toward a support wall;

FIG. 1N is a front elevational, partial cross-sectional view of a portion of the device of FIG. 1A, wherein the hollow body is placed the support wall;

DETAILED DESCRIPTION OF THE INVENTION

Figure 1A:
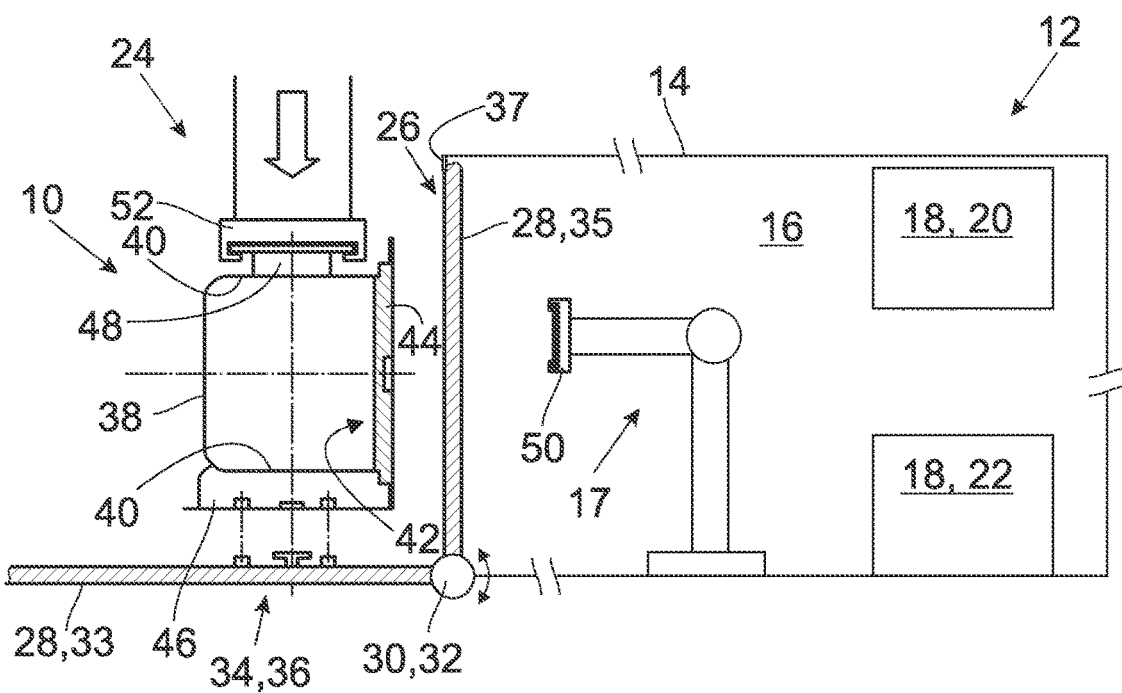
FIG. 1A is a front elevational, partial cross-sectional view of a device for handling pot-shaped hollow bodies showing an initial step of a method according to a proposal for handling the pot-shaped hollow bodies, in particular as step for handling transport containers for semiconductor wafers or for EUV lithography masks, using an embodiment of a device according to a proposal of a preferred embodiment of the present invention.
Figure 1B:
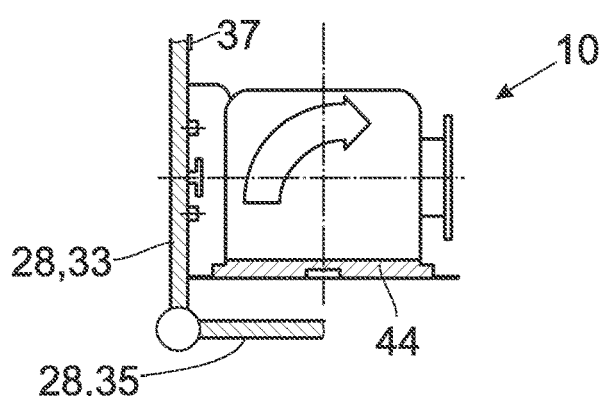
FIG. 1B is a front elevational, partial cross-sectional view of a portion of the device of FIG. 1A, wherein a closure body is moved to a second position.
Figure 1C:
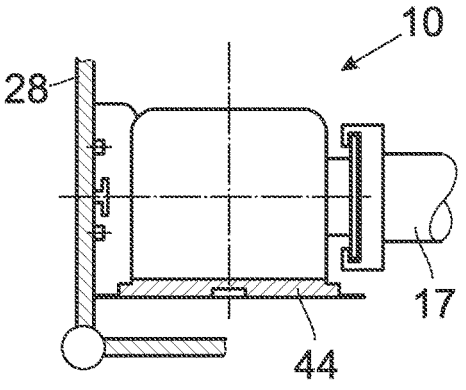
FIG. 1C is a front elevational, partial cross-sectional view of a portion of the device of FIG. 1A, wherein a hollow body is gripped by a moving device.
Figure 1D:
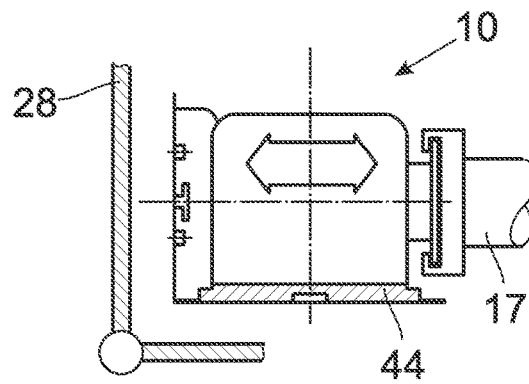
FIG. 1D is a front elevational, partial cross-sectional view of a portion of the device of FIG. 1A, wherein the hollow body of FIG. 1C is removed from the closure body and in an inner space.
Figure 1E:
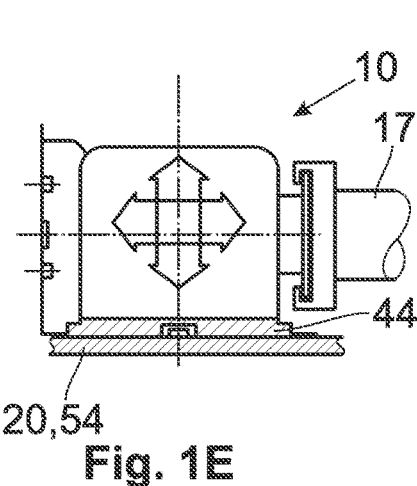
FIG. 1E is a front elevational, partial cross-sectional view of a portion of the device of FIG. 1A, wherein the hollow body of FIG. 1C is moved to a cover handling unit.
Figure 1F:
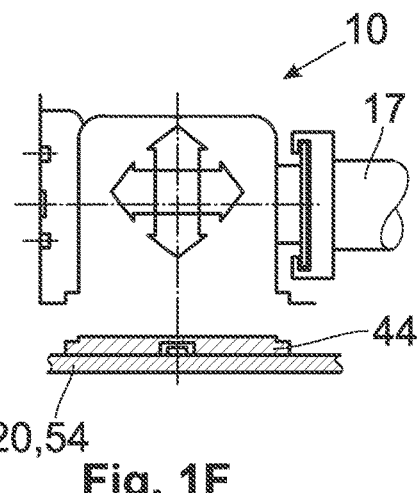
FIG. 1F is a front elevational, partial cross-sectional view of a portion of the device of FIG. 1A, wherein the hollow body is removed from the cover handling unit of FIG. 1E.
Figure 1G:
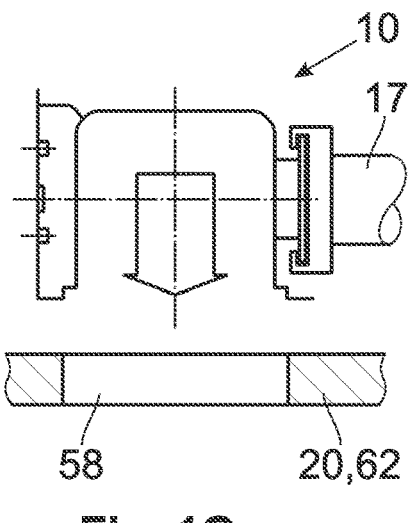
FIG. 1G is a front elevational, partial cross-sectional view of a portion of the device of FIG. 1A, wherein the hollow body is transported by the moving device of FIG. 1C into a cleaning device.
Figure 1H:
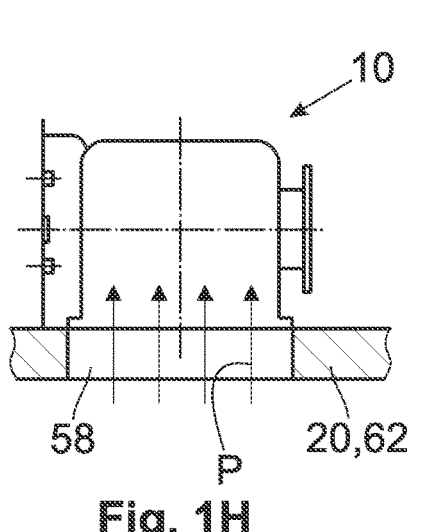
FIG. 1H is a front elevational, partial cross-sectional view of a portion of the device of FIG. 1A, wherein the hollow body is fastened to a support wall.
Figure 1H:
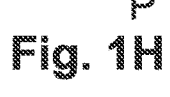
Figure 1I:
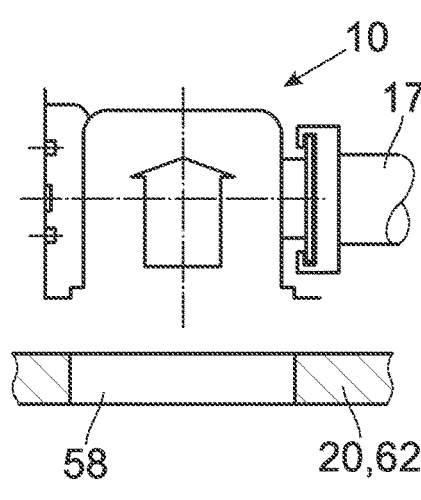
FIG. 1I is a front elevational, partial cross-sectional view of a portion of the device of FIG. 1A, wherein the hollow body is gripped by the moving device and removed from the support wall.
Figure 1O:
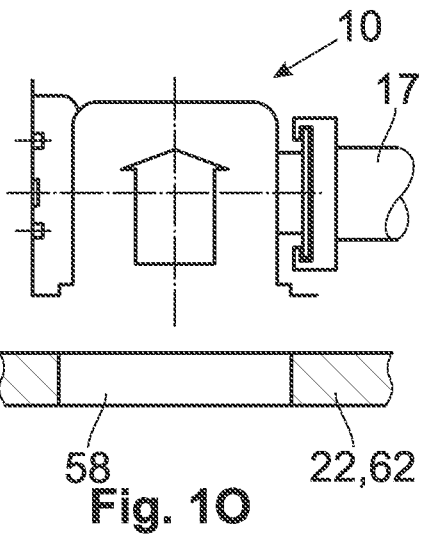
FIG. 1O is a front elevational, partial cross-sectional view of a portion of the device of FIG. 1A, wherein the hollow body is removed from the support wall by the moving device.
Figure 1P:
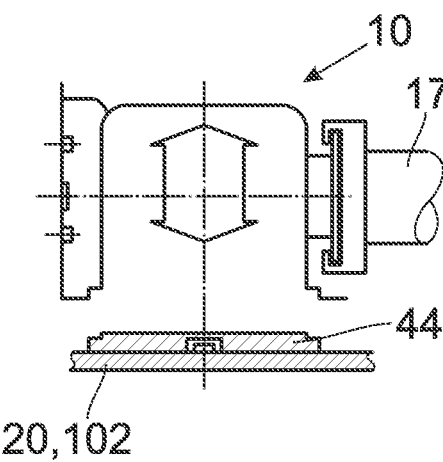
FIG. 1P is a front elevational, partial cross-sectional view of a portion of the device of FIG. 1A, wherein the hollow body is transported to the cover handling unit of FIG. 1E.
Figure 1Q:
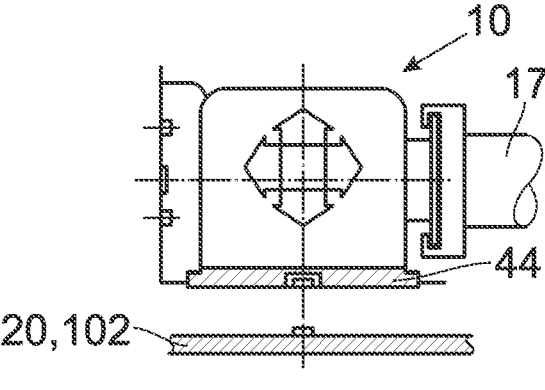
FIG. 1Q is a front elevational, partial cross-sectional view of a portion of the device of FIG. 1A, wherein the cover of FIG. 1K is connected to the hollow body and removed from the cover handling unit by the moving device.
Figure 1R:
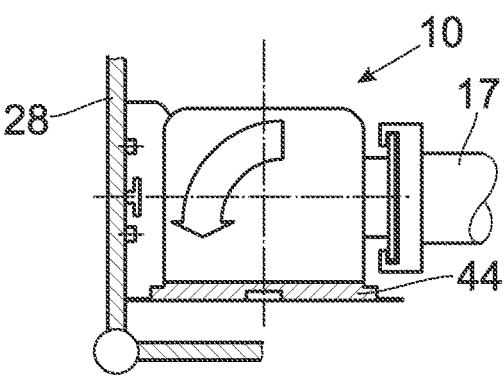
FIG. 1R is a front elevational, partial cross-sectional view of a portion of the device of FIG. 1A, wherein the hollow body is moved back to the closure body in the second position and placed onto a reception section.
Figure 1S:
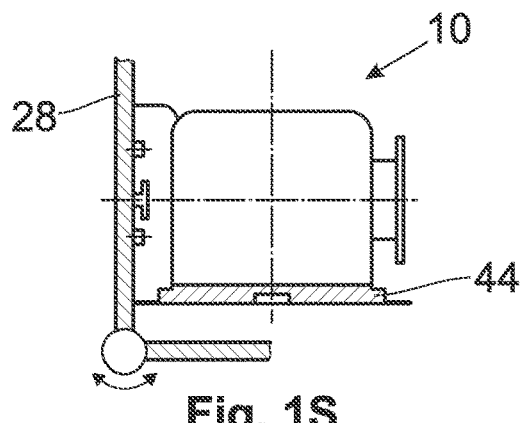
FIG. 1S is a front elevational, partial cross-sectional view of a portion of the device of FIG. 1A, wherein the moving device is released from the hollow body.
Figure 1T:
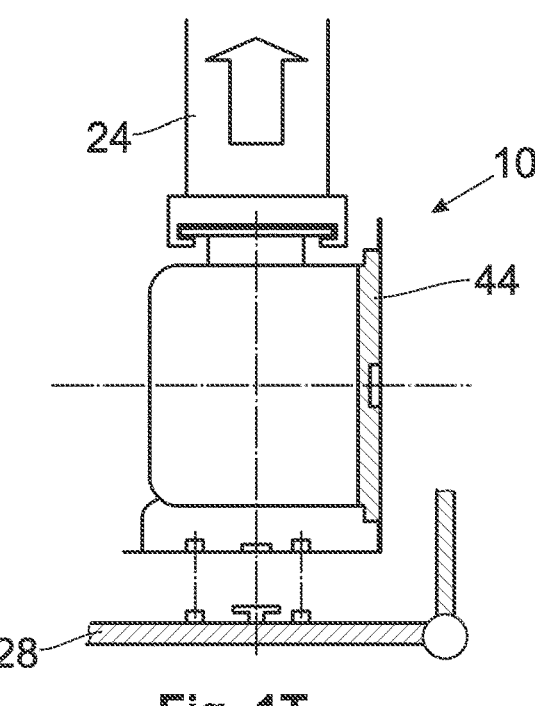
FIG. 1T is a front elevational, partial cross-sectional view of a portion of the device of FIG. 1A, wherein the closure body is moved into the first position.

Different steps of a method according to a proposal for handling pot-shaped hollow bodies 10, in particular transport containers for semiconductor wafers, are shown with reference to basic sectional representations in FIGS. 1A-1T. A device 12 in accordance with the preferred invention is likewise shown in principle in FIG. 1A by which the method according to a proposal can be carried out. The hollow bodies 10 are also called FOUPs.

The device 12 in accordance with the preferred invention comprises a wall 14 that surrounds an inner space 16. A gripping and moving device or moving device 17 is provided in the inner space 17 by which the hollow bodies 10 to be handled can be moved in the inner space 16. In addition, two handling units 18, namely a first handling unit 181 that is formed as a cleaning device 20 and is shown in detail in FIG. 2 and a second handling unit 182 that is formed as an evacuation device 22 and is shown in more detail in FIG. 3, are located in the inner space 16.

The device 12 is furthermore equipped with a further gripping and moving device 24 by which the hollow bodies 10 can be moved outside the inner space. The further gripping and moving device 24 is formed in the manner of an overhead transport system ("OHT") in which the hollow bodies 10 are transported in the proximity of the top.

The wall 14 forms a wall opening 26 that is closable by a closure body 28 and through which the inner space 16 is accessible. The closure body 28 is movably supported in the device 12 by means of a fastening unit 30. In this case, the fastening unit 30 is formed as a hinge 32 by which the closure body 28 is rotatably fastened to the wall 14 in the manner of a flap. The closure body 28 is movable between a first position and a second position.

The closure body 28 furthermore has a reception section 34 by which the hollow body 10 can be releasably fastened to the closure body 28. In the embodiment shown, suitably formed locking means 36 are provided in the reception section 34 for this purpose.

In the embodiment shown, the closure body 28 is of L shape and has a first limb 33 and a second limb 35 that include an angle of 90° with one another and are respectively connected to the hinge 32. The reception section 34 is arranged on the first limb 33 that is located outside the inner space 16 in the first position. The second limb 35 closes the opening 26 when the closure body 28 is in the first position, with the second limb 35 contacting a seal 37 that surrounds the opening 26.

To move the closure body 28 into the second position, it is rotated by 90° (see FIG. 1B). In the second position, the first limb 33 contacts the seal 37 so that the opening 26 is closed by the first limb 33. The opening 26 is consequently only opened when the closure body 28 is moved between the first position and the second position.

The hollow body 10 is formed substantially in parallel-epiped shape and comprises a base wall 38 and four side walls 40, an opening 42 disposed opposite the base wall 38, and a cover 44 by which the opening 42 is closable. In addition, the hollow body 10 is provided with a first gripping section 46 and a second gripping section 48 that are each arranged at one of the side walls 40. The first gripping section 46 is configured such that it can cooperate with the locking means 36 of the reception section 34 of the closure body 28, whereby the hollow body 10 can be releasably connected to the closure body 28. The second gripping section 48 is T-shaped in cross-section and is therefore also called a "mushroom".

The gripping and moving device 17 has gripping means 50 and the further gripping and moving device 24 has further gripping means 52 that have substantially the same design and that can cooperate with the second gripping section 48 of the hollow body 10 so that the hollow body 10 can be gripped.

A method will be described with reference to FIGS. 1A to 1T by which the device 12 can be operated. In this respect, only the components of the device 12 that directly participate in the method are shown in FIGS. 1B to 1T, with the representation being simplified in part for reasons of clarity.

The hollow body 10 is gripped by the further gripping means 52 of the further gripping and moving device 24 at the second gripping section 48 (not explicitly shown) and is transported toward the device 12. Once the hollow body 10 has reached the correct position, it is lowered by the further gripping and moving device 24 and is placed on the closure body 28, that is located in the first position, in particular on the reception section 34, so that the hollow body 10 can be fastened to the closure body 28 by the locking means 36 (FIG. 1A). The further gripping means 52 are released and the further gripping and moving device 24 is removed from the hollow body 10 (not shown). The closure body 28 is now moved into the second position, for which purpose it is rotated by approximately 90° by a drive unit that is not shown (FIG. 1B). The wall opening 26 is closed here and the hollow body 10 is introduced into the inner space 16. The hollow body 10 is subsequently gripped at the second gripping section 48 by the gripping means 50 of the gripping and moving device 17 (FIG. 1C and the locking means 36 of the closure body 28 are then released. The hollow body 10 can now be removed from the closure body 28 (FIG. 1D) and moved in the inner space 16 with the aid of the gripping and moving device 17. It can be seen from FIG. 1E that the hollow body 10 is now moved to a cover handling unit 54 that is movably supported in the cleaning device 20 by means of a further fastening device 57 (see FIG. 2). The operating mode of the cover handling unit 54 will be looked at more exactly below. The cover handling unit 54 is releasably connectable to the cover 44 of the hollow body 10. For this purpose, the cover 44 of the hollow body 10 is placed on the cover handling unit 54 and connection means 55 (see FIG. 2) are activated by which the cover 44 can be releasably connected to the cover handling unit 54. The hollow body 10 is subsequently removed from the cover handling unit 54 by the gripping and moving device 17, with the cover 44 remaining at the cover handling unit 54 (see FIG. 1F). The open hollow body 10 is then transported by the gripping and moving device 17 into the cleaning device 20 (FIG. 1G), where the hollow body 10 is placed onto a support wall 62 of the cleaning device 20 on which the hollow body 10 is fastened by fixing means 63 (see FIG. 2). The support wall 62 has a passage opening 58 that is adapted to the size of the hollow body 10. The hollow body 10 is, as can be seen from FIG. 1H, fastened to the support wall 62 such that the passage opening 58 is approximately flush with the side walls 40 of the hollow body 10. The gripping and moving device 17 is released from the hollow body 10 and the inner surface of the hollow body 10 is cleaned by addition of a cleaning fluid, as is indicated by the arrows P in FIG. 1H. Once the cleaning has been completed, the hollow body 10 is again gripped by the gripping and moving device 17 and is removed from the support wall 62 (FIG. 1I). The hollow body 10 is now again moved to the cover handling unit 54 of the cleaning device 20 (FIG. 1J) and the cover 44 is again connected to the hollow body 10 (FIG. 1K).

The hollow body 10 is then transported by the gripping and moving device 17 to the evacuation device 22 that likewise has a cover handling unit 102 that has substantially the same design as the cover handling unit 54 of the cleaning device 20. The cover 44 is in turn connected to the cover handling unit 102 of the evacuation device 22 and is released from the hollow body 10 (FIG. 1L). The hollow body 10 is subsequently moved toward a support wall 62 of the evacuation device 22 (FIG. 1M) and placed on it (FIG. 1N) A vacuum is subsequently built up in the inner space 16 of the hollow body 10 by means of a vacuum pump 64 that is connected to a vacuum connector 66 of the evacuation device 22 (FIG. 3), which is symbolized by Dp in FIG. 1N. The gripping and moving device 17 is meanwhile separated from the hollow body 10.

Once the evacuation procedure has been completed, the gripping and moving device 17 is again connected to the hollow body 10 and the hollow body 10 is transported to the cover handling unit 102 of the evacuation device 22 (FIGS. 1O and 1P). The cover 44 is connected to the hollow body 10 and is removed from the cover handling unit 54 (FIG. 1Q). The hollow body 10 is moved back to the closure body 28 located in the second position and is there placed onto the reception section 34 so that the hollow body 10 is fixedly connected to the closure body 28 as a consequence of the activation of the locking means 36 (FIG. 1R). The gripping and moving device 17 is now released from the hollow body 10 (FIG. 1S) and the closure body 28 is moved into the first position (FIG. 1T) in which the hollow body 10 is gripped by the further gripping and moving device 24. The locking means 36 are released and the hollow body 10 is removed from the closure body 28. A further hollow body 10 can now be placed onto the reception section 34 by the further gripping and moving device 24 and can be handled in the described manner.

Figure 2:
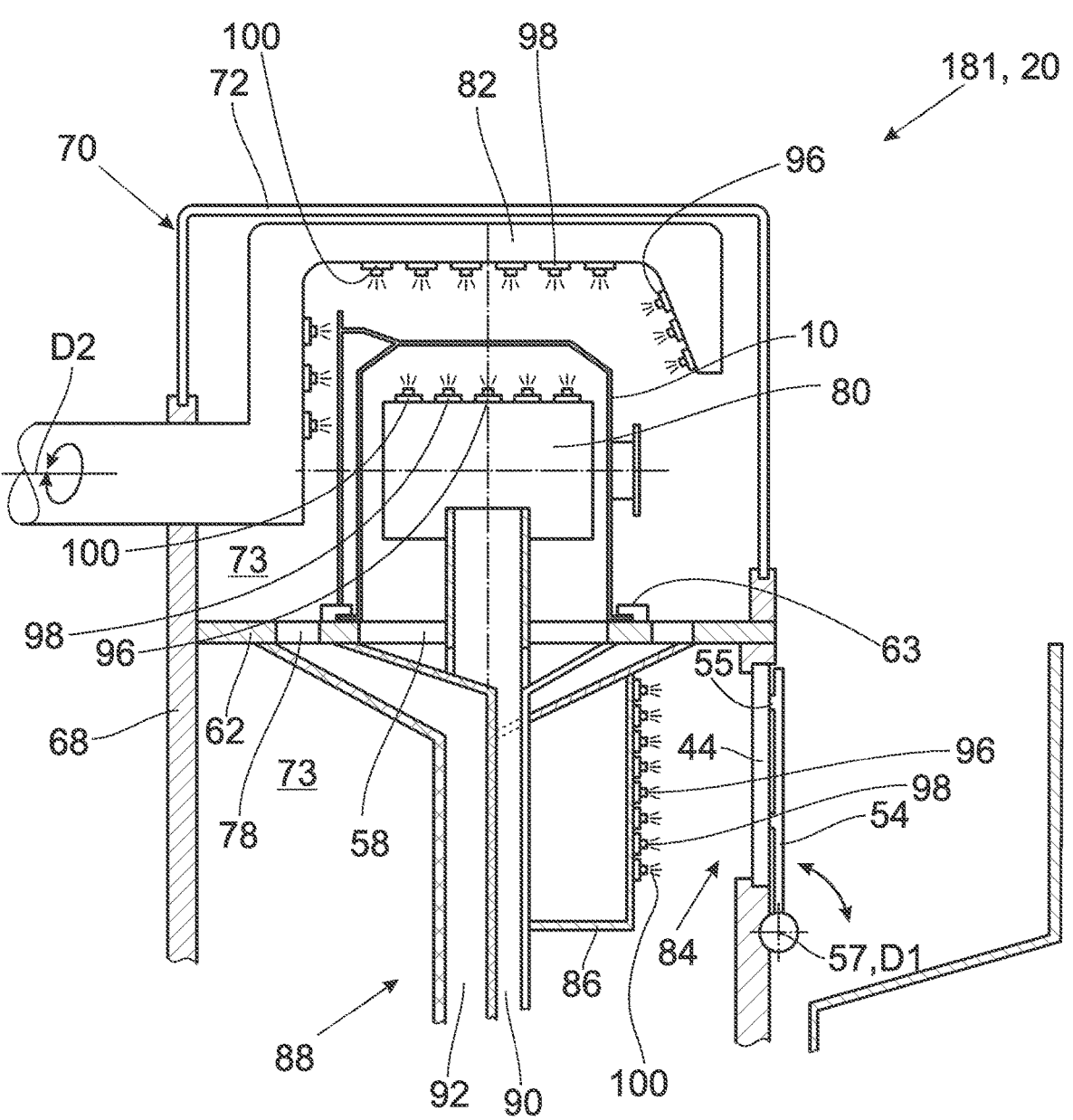
FIG. 2 is a front elevational, partial cross-sectional view of a handling unit designed as a cleaning device.
Figure 3:
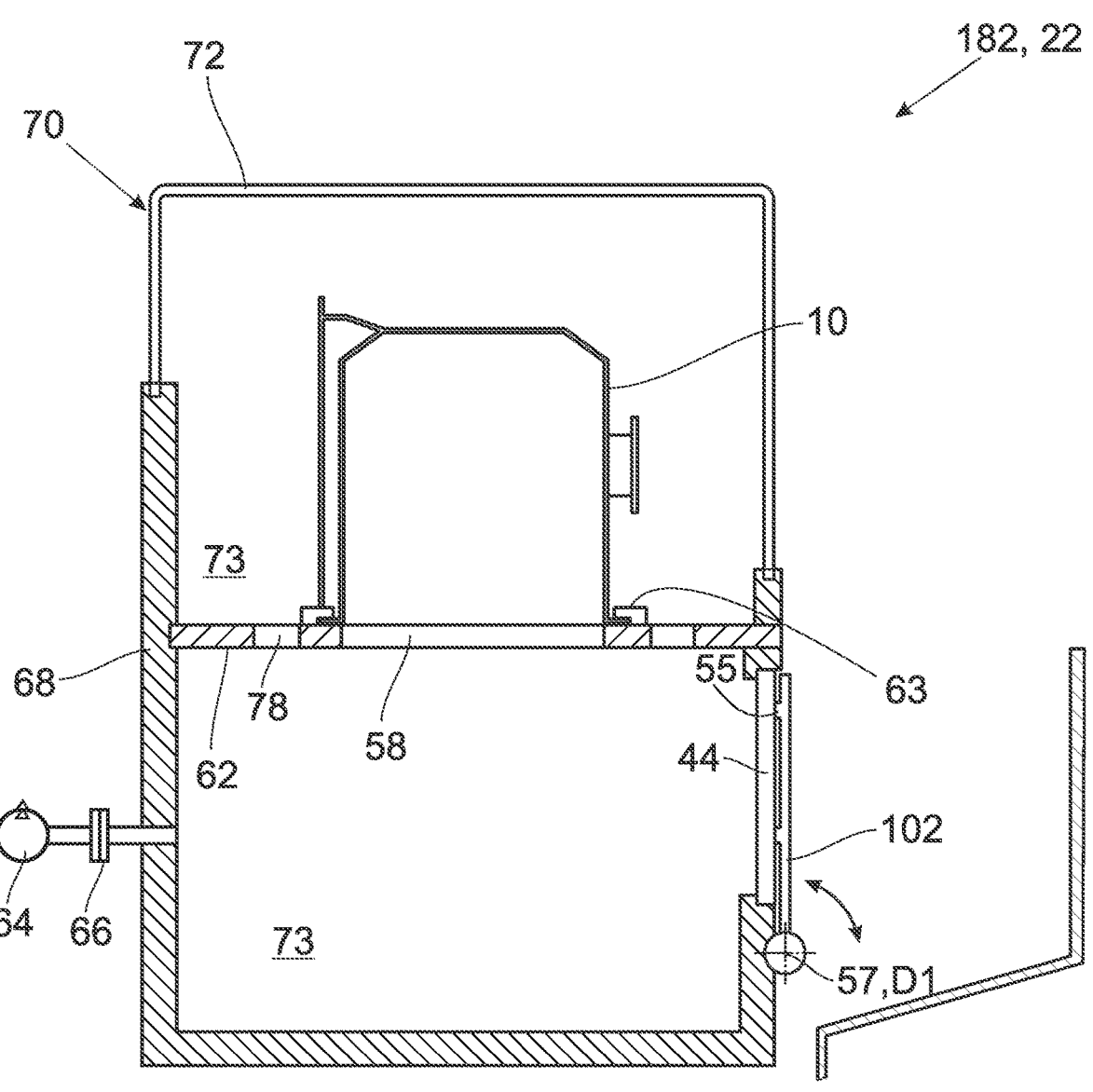
FIG. 3 is a front elevational, partial cross-sectional view of a handling unit designed as an evacuation device, in each case with reference to basic sectional representations.

In FIG. 2, the cleaning device 20 is shown in detail by which the cleaning step shown in FIG. 1N can be carried out. The cleaning device 20 has a housing 68 that forms a housing opening 70 that is closable by a covering 72 removable from the housing 68. The already described support wall 62 is furthermore arranged in the housing 68. The cleaning device 20 forms a process space 73 that is bounded by the housing 68 itself and by the covering 72. The support wall 62 forms the already described passage opening 58, with the already mentioned fixing means 63 being arranged radially outside the passage opening 58. Two passage bores 78 are provided in the support wall 62 radially outside the fixing means 63 in the embodiment shown.

The cleaning device 20 has a first cleaning head 80 that projects over the passage opening 58. The cleaning device 20 moreover comprises a second cleaning head 82 that has a substantially U shape. The second cleaning head 82 is rotatable about a second rotational axis D2, with the drive device used for this purpose not being shown.

The housing 68 further forms a process space opening 84 through which the process space 73 is accessible. The process space opening 84 is connectable to the already mentioned cover handling unit 54 that is rotatably fastened at the housing 68 by a further fastening device 57 about a first rotational axis D1. The cover handling unit 54 can be moved by a drive unit, not shown, between an open position in which the cover handling unit 54 releases the process space opening 84 and a closure position in which the cover handling unit 54 closes the process space opening 84. The cover handling unit 54 is in the closure position in FIG. 2.

The cleaning device 20 is additionally equipped with a further first cleaning head 86 that is arranged in the vicinity of the cover handling unit 54 when it is in the closure position.

The cleaning device 20 furthermore comprises a fluid conducting unit 88 by which a first cleaning fluid can be conducted to the first cleaning head 80 and to the further first cleaning head 86 and a second cleaning fluid can be conducted to the second cleaning head 82 in a manner not shown in any more detail. The fluid conducting unit 88 furthermore comprises a first drainage channel 90 by which the first cleaning fluid dispensed by the first cleaning head 80 and by the further first cleaning head 86 can be drained from the process space 73 again.

The fluid conducting unit 88 furthermore has a second drainage channel 92 that is in fluid communication with the two passage bores 78. The first cleaning fluid and the second cleaning fluid can consequently be conducted separately in the cleaning device 20.

The cover handling unit 54 has already been mentioned with respect to FIGS. 1E and 1F. The operating mode of the cover handling unit 54 will be described more exactly in the following with reference to FIG. 2. The cover 44 of the hollow body 10 is placed onto the cover handling unit 54 when it is in the open position. The cover handling unit 54 comprises connection means 55 that are now activated so that the cover 44 is fastened to the cover handling unit 54. The hollow body 10 is removed from the cover 44 and is placed on the support wall 62 by the gripping and moving device 17, with the covering 72 being arranged such that it releases the housing opening 72 and consequently access to the process space 73. The gripping and moving device 17 is subsequently separated from the hollow body 10.

The cover handling unit 54 is rotated about the first rotational axis D1 and the process space opening 84 is closed. The covering 72 is also arranged as is shown in FIG. 2 to close the process space 73. The cleaning fluid is now applied to the inner hollow body surface by the first cleaning head 80, to the inner cover surface by the further first cleaning head 86, and onto the outer hollow body surface by the second cleaning head 82. For this purpose, the first cleaning head 80, the further first cleaning head 86, and the second cleaning head 82 each have cleaning nozzles 96.

A drying gas is subsequently applied by drying nozzles 98 of the first cleaning head of the further first cleaning head 86, and of the second cleaning head 82 to the inner hollow body surface, to the inner cover surface, and to the outer hollow body surface to remove the cleaning fluid. In addition, the first cleaning head 80, the further first cleaning head 86, and the second cleaning head 82 have infrared diodes 100 by which residues of the cleaning fluid that are located on the inner hollow body surface, the inner cover surface, and the outer hollow body surface can be heated and evaporated.

The covering 72 is subsequently removed, the hollow body 10 is connected to the gripping and moving device 17, and the cover handling device 54 is moved into the open position. The hollow body 10 is raised from the support wall 62 by means of the gripping and moving device 17 and is moved onto the cover handling unit 54. The connection means 55 are deactivated. The cover 44 is now again connected to the hollow body 10 and is transported by the gripping and moving device 17 to the evacuation device 22 shown in more detail in FIG. 3.

The evacuation device 22 is substantially designed like the cleaning device 20, but it does not have any fluid conducting unit or any cleaning heads. The evacuation device 22 rather has the already mentioned vacuum connector 66 to which the likewise mentioned vacuum pump 64 can be connected so that a vacuum can be applied in the process space 73.

The evacuation device 22 is equipped with a cover handling unit 102 that has substantially the same design as the cover handling unit 54. The supply of the hollow body 10 to the evacuation device 22 takes place in substantially the same manner as has been described for the cleaning device 20. The covering 72 is connected as shown to the housing in FIG. 3 and the cover handling unit 54 is in the closure position so that the process spade 73 is closed. The vacuum pump 64 is now activated and a vacuum is applied in the process space 73. Residues of the cleaning fluid that are on the inner hollow body surface, the inner cover surface, and the outer hollow body surface are removed.

On completion of the evacuation procedure, the covering 72 is removed so that access to the process space 73 is again possible. The gripping and moving device 17 is connected to the hollow body 10 and the cover handling unit 54 is moved into the open position where the cover 44 can be connected to the hollow body 10 in the described manner. The hollow body 10 is now completely cleaned and can be transported onward as shown in FIGS. 1R to 1T.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

REFERENCE NUMERAL LIST 10 hollow body
12 device
14 wall
16 inner space
17 gripping and moving device
18 handling unit
181 first handling unit
182 second handling unit
20 cleaning device
22 evacuation device
24 further gripping and moving device
26 wall opening

28 closure body
30 fastening unit
32 hinge
34 reception section
36 locking means
38 base wall
40 side wall
42 opening
44 cover
46 first gripping section
48 second gripping section
50 gripping means
52 further gripping means
54 cover handling unit
55 connection means
57 further fastening device
58 passage opening
62 support wall
63 fixing means
64 vacuum pump
66 vacuum connector
68 housing
70 housing opening
72 covering
73 process space
78 passage bore
80 first cleaning head
82 second cleaning head
84 process space opening
86 further first cleaning head
88 fluid conducting unit
90 first drainage channel
92 second drainage channel
96 cleaning nozzle
98 drying nozzle
100 infrared diodes
102 cover handling unit
D1 first rotational axis
D2 second rotational axis
P arrows

The invention claimed is:

1. A device for handling a hollow body having a pot-shape comprised of a transport container for semiconductor wafers or for EUV lithography masks, the device comprising:

a wall that surrounds an inner space;

a gripping and moving device arranged in the inner space for moving the hollow body within the inner space; and a wall opening that is formed by the wall, the wall opening being closable by a closure body, the inner space is accessible through the wall opening, the closure body being movably supported in the device by a fastening unit and having a reception section by which the hollow body is releasably connectable to the closure body, the hollow body includes a first gripping section on a first side wall and a second gripping section on an opposite second side wall, the reception section includes a locking device by which the closure body cooperates with the hollow body using the first gripping section, the gripping and moving device includes a gripping and releasing device by which the gripping and moving device cooperates with the hollow body using the second gripping section.

2. The device in accordance with claim 1, wherein the fastening unit is formed as a hinge by which the closure body is rotatably fastened to the wall.

3. The device in accordance with claim 1, wherein the closure body is movable between a first position and a second position, with the closure body closing the wall opening in the first position and in the second position.

4. The device in accordance with claim 1, further comprising:

a further gripping and moving device for supplying the hollow body to the closure body and for removing the hollow body from the closure body.

5. The device in accordance with claim 4, wherein the further gripping and moving device has a further gripping and releasing device by which the further gripping and moving device can cooperate with the hollow body using the second gripping section.

6. The device in accordance with claim 1, wherein the hollow body has a base wall, an opening disposed opposite the base wall, a cover by which the opening is closable, a cover handling unit releasably connectable to the cover.

7. The device in accordance with claim 6, further comprising:

a handling unit by which the hollow body can be handled, the handling unit having a process space in which the hollow body can be handled, the process space being accessible through a process space opening, the cover handling unit being movably supported by a further fastening device between an open position in which the cover handling unit releases the process space opening and a closure position in which the cover handling unit closes the process space opening.

8. The device in accordance with claim 7, wherein the handling unit is formed as a cleaning device for cleaning the hollow body or the cover.

9. The device in accordance with claim 7, further comprising:

a second handling unit that is formed as an evacuation device for applying a vacuum in the hollow body or at the cover.

10. A method of handling the hollow body using the device in accordance with claim 1, said method comprising the following steps:

moving the closure body between a first position and a second position in which the closure body releases the wall opening;

supplying the hollow body to the reception section by a further gripping and moving device that has a further gripping and releasing device by which the further gripping and moving device is connected to the hollow body using the second gripping section and activating the locking device of the reception section to connect the hollow body to the closure body using the first gripping section;

moving the closure body into a closed position in which the closure body closes the wall opening;

connecting the hollow body to the gripping and moving device using the second gripping section; and releasing the hollow body from the closure body by deactivating the reception section.

11. The method in accordance with claim 10, wherein the hollow body has a base wall, an opening disposed opposite the base wall and a cover by which the opening is closable, the method including the further steps:

supplying the hollow body to a cover handling unit with the gripping and moving device;

connecting the cover to the cover handling unit; and separating the cover from the hollow body with the cover handling unit or the gripping and moving device.

12. The method in accordance with claim 11, further comprising:

a handling unit by which the hollow body can be handled, the handling unit cooperating with the cover handling unit, wherein the handling unit has a process space in which the hollow body can be handled, the process space being accessible through a process space open- ing, the method including the further steps:

moving the cover handling unit into an open position in which the cover handling unit releases the process space opening;

connecting the cover to the cover handling unit and separating the cover from the hollow body with the cover handling unit or the gripping and moving device; and moving the cover handling unit into the closed position in which the cover handling unit closes the process space opening.

\* \* \* \* \*